United States Patent
Jang et al.

(10) Patent No.: US 12,408,322 B2
(45) Date of Patent: Sep. 2, 2025

(54) SEMICONDUCTOR STRUCTURE AND METHOD FOR MANUFACTURING THE SAME

(71) Applicant: CHANGXIN MEMORY TECHNOLOGIES, INC., Hefei (CN)

(72) Inventors: Semyeong Jang, Hefei (CN); Joonsuk Moon, Hefei (CN); Deyuan Xiao, Hefei (CN); Minki Hong, Hefei (CN); Kyongtaek Lee, Hefei (CN); Jo-Lan Chin, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 392 days.

(21) Appl. No.: 17/935,567

(22) Filed: Sep. 26, 2022

(65) Prior Publication Data

US 2023/0014884 A1    Jan. 19, 2023

Related U.S. Application Data

(63) Continuation of application No. PCT/CN2022/102663, filed on Jun. 30, 2022.

(51) Int. Cl.
*H10B 12/00* (2023.01)
*G11C 5/06* (2006.01)

(52) U.S. Cl.
CPC ........... *H10B 12/315* (2023.02); *G11C 5/063* (2013.01); *H10B 12/05* (2023.02)

(58) Field of Classification Search
CPC .. H10B 12/315; H10B 12/05; H10B 12/0335; G11C 5/063
See application file for complete search history.

(56) References Cited

U.S. PATENT DOCUMENTS

| | | | |
|---|---|---|---|
| 5,244,824 | A | 9/1993 | Sivan |
| 6,376,303 | B1 | 4/2002 | Seo |
| 8,293,604 | B2 | 10/2012 | Yoon |
| 9,673,257 | B1 | 6/2017 | Takaki |
| 2006/0043471 | A1 | 3/2006 | Tang |
| 2006/0046391 | A1 | 3/2006 | Tang |

(Continued)

FOREIGN PATENT DOCUMENTS

| | | |
|---|---|---|
| CN | 101017825 A | 8/2007 |
| CN | 101740500 A | 6/2010 |

(Continued)

*Primary Examiner* — Jonathan Han

(74) *Attorney, Agent, or Firm* — SYNCODA LLC; Feng Ma

(57) ABSTRACT

A semiconductor structure includes a base, a dielectric layer, a gate structure, and a covering layer. The base includes discrete semiconductor pillars. The semiconductor pillars are disposed at the top of the base and extend in a vertical direction. The dielectric layer covers the sidewall of the semiconductor pillar. The gate structure is disposed in the middle area of the semiconductor pillar. The gate structure includes a gate-all-around structure, the gate-all-around surrounding the semiconductor pillar. A first part of the dielectric layer is disposed between the gate structures and the semiconductor pillars. The covering layer covers the top of the semiconductor pillar and part of the sidewall close to the top. The material of the covering layer includes a boron-containing compound.

15 Claims, 14 Drawing Sheets

(56) References Cited

U.S. PATENT DOCUMENTS

| | | |
|---|---|---|
| 2007/0020819 A1 | 1/2007 | Tang |
| 2007/0048943 A1 | 3/2007 | Tang |
| 2007/0181925 A1 | 8/2007 | Yoon |
| 2007/0224753 A1 | 9/2007 | Tang |
| 2009/0072291 A1 | 3/2009 | Takaishi |
| 2009/0207649 A1 | 8/2009 | Tang |
| 2010/0120221 A1* | 5/2010 | Kang ............... H10D 30/63 438/430 |
| 2010/0213525 A1 | 8/2010 | Masuoka |
| 2011/0104862 A1 | 5/2011 | Kadoya |
| 2011/0171796 A1 | 7/2011 | Tang |
| 2013/0011987 A1* | 1/2013 | Park ............... H10D 30/025 438/585 |
| 2013/0056698 A1 | 3/2013 | Satoh |
| 2013/0075813 A1 | 3/2013 | Kadoya |
| 2015/0017767 A1 | 1/2015 | Masuoka et al. |
| 2015/0380548 A1 | 12/2015 | Wang et al. |
| 2016/0204251 A1 | 7/2016 | Masuoka et al. |
| 2017/0271510 A1 | 9/2017 | Wang et al. |
| 2017/0309632 A1 | 10/2017 | Masuoka et al. |
| 2017/0323977 A1 | 11/2017 | Cheng et al. |
| 2018/0083136 A1 | 3/2018 | Xie et al. |
| 2018/0096896 A1 | 4/2018 | Zhu |
| 2018/0175212 A1 | 6/2018 | Cheng et al. |
| 2019/0027570 A1 | 1/2019 | Ching et al. |
| 2019/0115438 A1 | 4/2019 | Ching et al. |
| 2019/0123053 A1 | 4/2019 | Masuoka et al. |
| 2019/0237581 A1 | 8/2019 | Saito et al. |
| 2019/0326395 A1 | 10/2019 | Ando et al. |
| 2020/0020812 A1 | 1/2020 | Masuoka et al. |
| 2020/0052084 A1 | 2/2020 | Ching et al. |
| 2021/0305431 A1 | 9/2021 | Ishimaru et al. |
| 2022/0069070 A1 | 3/2022 | Lai et al. |
| 2022/0102347 A1 | 3/2022 | Lai et al. |
| 2022/0139918 A1 | 5/2022 | Lee |
| 2022/0139920 A1 | 5/2022 | Lee |
| 2022/0199837 A1 | 6/2022 | Masuoka et al. |
| 2022/0262954 A1 | 8/2022 | Ishimaru et al. |
| 2023/0100189 A1* | 3/2023 | Kim ................ H10D 30/6757 257/401 |
| 2023/0335436 A1* | 10/2023 | Wang ............... H01L 23/5226 |

FOREIGN PATENT DOCUMENTS

| | | |
|---|---|---|
| CN | 101933135 A | 12/2010 |
| CN | 102867752 A | 1/2013 |
| CN | 105280698 A | 1/2016 |
| CN | 106252352 A | 12/2016 |
| CN | 107845578 A | 3/2018 |
| CN | 110476230 A | 11/2019 |
| CN | 110931429 A | 3/2020 |
| CN | 113078155 A | 7/2021 |
| CN | 113078156 A | 7/2021 |
| CN | 113451405 A | 9/2021 |
| CN | 114464535 A | 5/2022 |
| CN | 114497039 A | 5/2022 |
| EP | 1804286 A1 | 7/2007 |
| WO | 2013033267 A1 | 3/2013 |

* cited by examiner

SEMICONDUCTOR STRUCTURE AND METHOD FOR MANUFACTURING THE SAME

CROSS-REFERENCE TO RELATED APPLICATIONS

This is a continuation application of International Patent Application No. PCT/CN2022/102663 filed on Jun. 30, 2022, which claims priority to Chinese Patent Application No. 202210645321.1 filed on Jun. 8, 2022. The disclosures of the above-referenced applications are hereby incorporated by reference in their entirety.

BACKGROUND

As the integration density of a dynamic memory develops to be higher, while the arrangement mode of transistors in a dynamic memory array structure and how to reduce the size of a single functional device in the dynamic memory array structure are researched, the electrical performance of the small-size functional device needs to be improved.

Higher density efficiency may be achieved when a Vertical Gate All Around (VGAA) transistor structure is used as an access transistor of the dynamic memory. However, in some implementations, the electrical performance of a semiconductor structure related to the access transistor is low.

SUMMARY

In view of this, embodiments of the present disclosure provide a semiconductor structure and a method for manufacturing the same.

The technical solutions of the embodiments of the present disclosure are implemented as follows.

The embodiments of the present disclosure provide a semiconductor structure, which may include: a base, a dielectric layer, gate structures, and a covering layer.

The base may include discrete semiconductor pillars. The semiconductor pillars are disposed at top of the base and extend in a vertical direction.

The dielectric layer covers the sidewalls of the semiconductor pillars.

The gate structures are disposed in the middle area of the semiconductor pillars. The gate structure may include a gate-all-around structure, and the gate-all-around surrounds the semiconductor pillar. A first part of the dielectric layer is disposed between the gate structures and the semiconductor pillars.

The covering layer covers the top of the semiconductor pillars and part of the sidewalls close to the top. The material of the covering layer may include a boron-containing compound.

In the above solution, the material of the covering layer may include a silicon boron material.

In the above solution, the silicon boron material is silicon boron nitride SiBxNy, and y−x≤2.

In the above solution, the boron silicon material is Boro Phospho Silicate Glass (BPSG) or boro silicate glass.

In the above solution, the gate structures may further include at least one bridge gate structure. The at least one bridge gate structure penetrates through the semiconductor pillars and extends to the inner walls of the gate-all-around structures in the penetrating direction. The at least one bridge gate structures are disposed in the semiconductor pillars and are disposed corresponding to the middle area of the gate-all-around structures.

In the above solution, the width of each bridge gate structure is less than that of the semiconductor pillar.

In the above solution, the gate structure may further include at least two bridge gate structures. The at least two bridge gate structures are stacked at an interval in the vertical direction, and the at least two bridge gate structures are isolated directly by the semiconductor pillar.

In the above solution, the top of the gate-all-around structure is lower than the top of the semiconductor pillar. The second part of the dielectric layer covers the top of the gate-all-around structure and is disposed between the gate-all-around structure and the covering layer. The thickness of the second part of the dielectric layer is greater than that of the first part of the dielectric layer.

In the above solution, the semiconductor structure may further include: a first isolation layer. The first isolation layer is disposed between the adjacent semiconductor pillars, and the gate structure is disposed between the first isolation layer and the semiconductor pillar.

In the above solution, the semiconductor structure may further include: a bit line. The bit line is disposed in the base. The bottom of the semiconductor pillar is connected with the bit line.

The embodiments of the present disclosure also provide a method for manufacturing a semiconductor structure, which may include the following operations.

A base is provided, the base is patterned, and discrete semiconductor pillars are formed on the base. The semiconductor pillars are disposed at the top of the base and extend in a vertical direction.

A dielectric layer is formed. The dielectric layer covers the sidewalls of the semiconductor pillars.

A gate structures are formed in the middle area of the semiconductor pillars. The gate structure may include a gate-all-around structure, and the gate-all-around surrounds the semiconductor pillar. A first part of the dielectric layer is disposed between the gate structures and the semiconductor pillars.

A covering layer is formed. The covering layer covers the top of the semiconductor pillars and part of the sidewalls close to the top. The material of the covering layer may include a boron-containing compound.

In the above solution, the gate structure may further include one bridge gate structure, the step of forming the gate structure may include that: a groove is formed in the semiconductor pillar; a sacrificial layer is formed in the groove; and a filling layer is formed in the groove, the filling layer is disposed on the sacrificial layer, and the remaining groove is filled with the filling layer.

In the above solution, the gate structure may further include at least two bridge gate structures, the step of forming the gate structure may include that: a groove is formed in the semiconductor pillar; a sacrificial layer is formed in the groove; part of the sacrificial layer is etched back, and a filling layer is formed in the groove, the filling layer being disposed on the remaining sacrificial layer; and the sacrificial layer and the filling layer are continued to be formed in the groove in sequence, and the top of the groove is filled with the filling layer.

In the above solution, the step of forming the gate structure may further include that: the sacrificial layer is removed to form a through hole: the through hole penetrates through the semiconductor pillar; a first initial dielectric layer is formed on the sidewall of the semiconductor pillar and the inner wall of the through hole: the part, disposed in the middle area of the semiconductor pillar, of the first initial dielectric layer forms the first part of the dielectric layer; the gate layer is formed around the sidewall of the initial dielectric layer through filling the through hole, and the part of the gate layer for filling the through hole forms a bridge gate structure; and the part of the gate layer around the sidewall of the first initial dielectric layer is etched to form the gate-all-around structure.

In the above solution, after the through hole is formed and before the first initial dielectric layer is formed, the manufacturing method may further include that: part of the sidewall of the semiconductor pillar is etched, so that the width of the middle area of the semiconductor pillar is smaller than the width of the bottom of the semiconductor pillar.

In the above solution, the step of forming the covering layer may include that: a second initial dielectric layer is formed on the gate structure and the semiconductor pillar: the second initial dielectric layer is etched until the top of the semiconductor pillar and part of the sidewall close to the top are exposed: the remaining second initial dielectric layer forms a second part of the dielectric layer; and the top of the semiconductor pillar and part of the sidewall close to the top are covered to form the covering layer.

DETAILED DESCRIPTION

In order to make the purposes, technical solutions and advantages of the present disclosure clearer, the technical solutions of the present disclosure are further described in details below in combination with the accompanying drawings and the embodiments. The described embodiments should not be regarded as limitations of the present disclosure. All other embodiments obtained by those of ordinary skill in the art without creative work shall fall within the scope of protection of the present disclosure.

In the following description, reference is made to "some embodiments" which describe a subset of all possible embodiments, but it can be understood that "some embodiments" may be the same or a different subset of all possible embodiments, and may be combined with each other without conflict.

If a similar description of "first/second" appears in the application document, the following description will be added. In the following description, the involved terms "first/second/third" are only used to distinguish similar objects, and do not represent a specific order of the objects. It can be understood that the specific order or sequence of "first/second/third" may be interchangeable under the allowable circumstances, so that the embodiments of the present disclosure described herein may be implemented in an order other than those illustrated or described herein.

Unless otherwise defined, all technical and scientific terms used herein have the same meaning as commonly understood by those skilled in the art of the present disclosure. The terms used herein is only for the purpose of describing the embodiments of the present disclosure and is not intended to limit the present disclosure.

Figure 1:
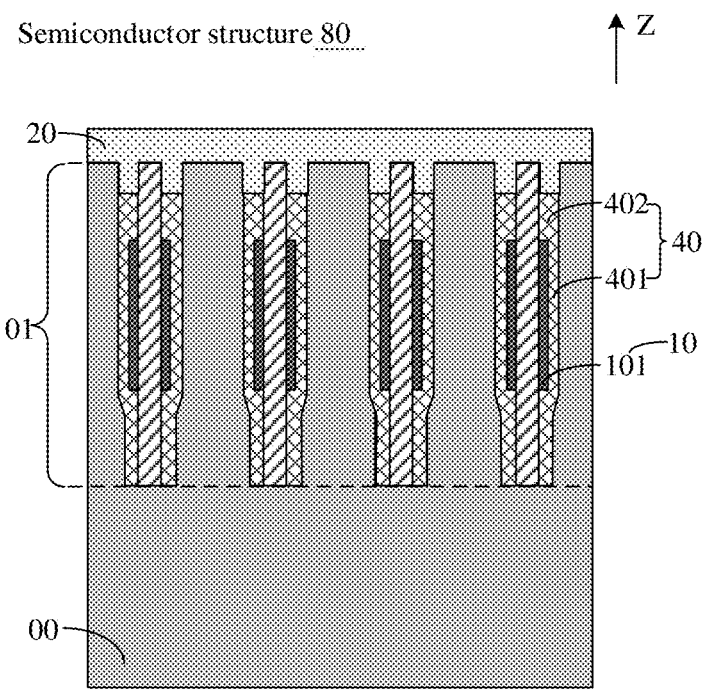
FIG. 1 is a schematic diagram I of a semiconductor structure provided by an embodiment of the present disclosure.

FIG. 1 is an optional schematic structural diagram of a semiconductor structure provided by an embodiment of the present disclosure, as shown in FIG. 1, the semiconductor structure 80 includes: a base 00, gate structures 10, a covering layer 20, and a dielectric layer 40.

The base 00 includes discrete semiconductor pillars 01. The semiconductor pillars 01 are disposed at the top of the base 00 and extend in a vertical direction Z.

The dielectric layer 40 covers the sidewalls of the semiconductor pillars 01.

The gate structures 10 are disposed in the middle area of the semiconductor pillars 01. The gate structure 10 includes a gate-all-around structure 101, the gate-all-around 101 surrounds the semiconductor pillar 01. A first part 401 of the dielectric layer 40 is disposed between the gate structure 10 and the semiconductor pillar 01.

The covering layer 20 covers the top of the semiconductor pillar 01 and part of the sidewall close to the top. The material of the covering layer 20 includes a boron-containing compound.

In the embodiment of the present disclosure, the base 00 may include at least one of semiconductor materials, for example, group IV elements such as silicon (Si), germanium (Ge), and silicon germanium (SiGe), or group III-V components such as gallium arsenide (GaAs), aluminum gallium arsenide (AlGaAs), indium arsenide (InAs), or indium gallium arsenide (InGaAs), and the following is exemplarily illustrated with the silicon element included in the base 00.

The semiconductor pillar 01 may have a doping element to improve the conductivity of the semiconductor pillar 01. Herein, the doping element may be a P-type doping element or an N-type doping element, and the N-type doping element may be at least one of an arsenic (As) element, a phosphorus (P) element, or an antimony (Sb) element. The P-type doping element may be at least one of a boron (B) element, an indium (In) element, or a gallium (Ga) element.

The material of the gate structure 10 may be titanium nitride (TiN), or at least one of conductive materials such as polycrystalline silicon, tantalum nitride (TaN), copper (Cu), or tungsten (W), and the following is exemplarily illustrated with titanium nitride. The material of the dielectric layer 40 may be silicon oxide (SiO).

In the embodiment of the present disclosure, the single semiconductor pillar 01, the gate structure 10 surrounds the semiconductor pillar 01, and the first part 401 of the dielectric layer 40 disposed between the semiconductor pillars 01 and the gate structures 10 may together form a first transistor. Herein, a channel area is formed in the middle area of the semiconductor pillar 01 corresponding to the gate structure 10, the gate structure 10 is used as a gate of the first transistor, and the parts 401 of the upper and lower ends of the middle area of the semiconductor pillar 01 respectively form a source and a drain. It is to be noted that the middle area of the semiconductor pillar 01 is the middle part of the semiconductor pillar 01 in the vertical direction Z, and the middle area of the semiconductor pillar 01 is between the top and the bottom of the semiconductor pillar 01 and has a certain distance from the top and the bottom. The first part 401 of the dielectric layer 40 is used as a gate dielectric of the first transistor.

The first transistor is a VGAA transistor, that is, the channel formed by the semiconductor pillar 01 extends in the vertical direction, and the gate-all-around structure 101 of the gate structure 10 surrounds the channel. Therefore, under the same size, compared with the transistor structures such as a Fin Field-Effect Transistor (FinFET), etc., the gate of the first transistor may more sufficiently cover the channel, so that the control ability of the gate is stronger.

Figure 2:
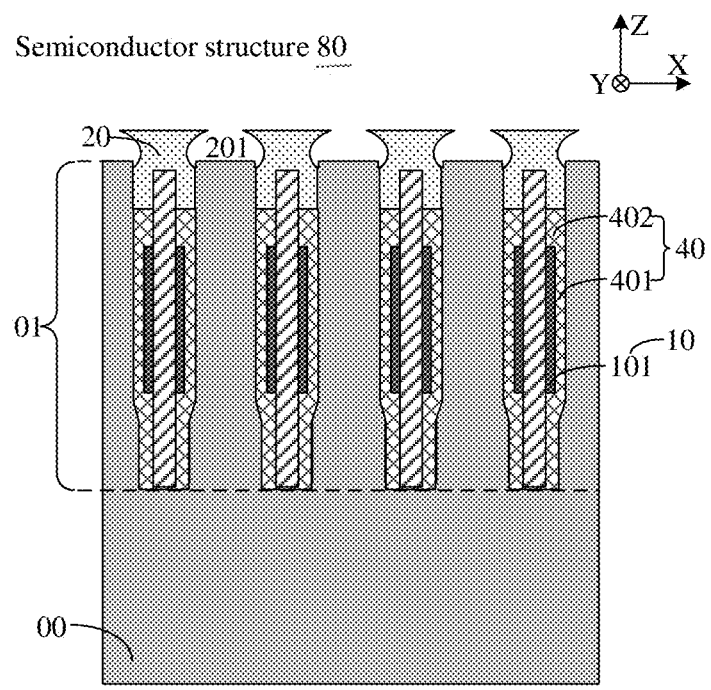
FIG. 2 is a schematic diagram II of a semiconductor structure provided by an embodiment of the present disclosure.
Figure 3:
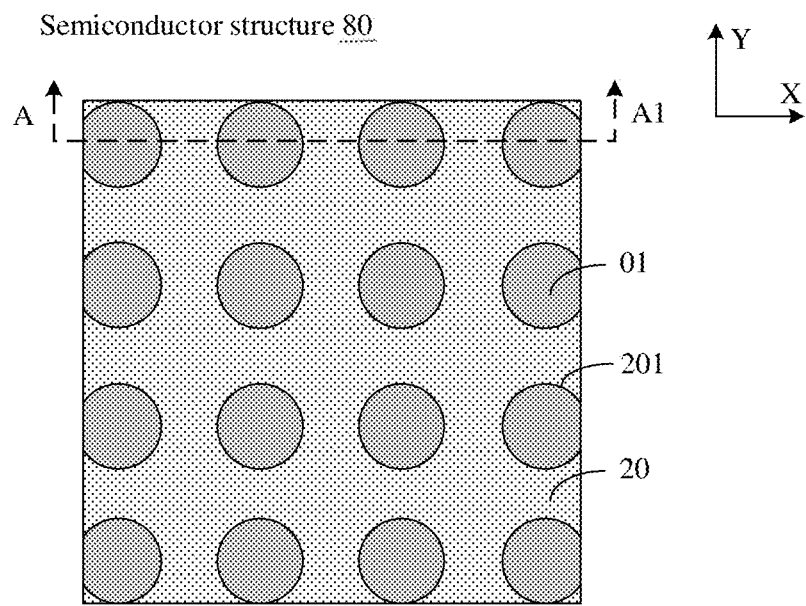
FIG. 3 is a schematic diagram III of a semiconductor structure provided by an embodiment of the present disclosure.

In the embodiment of the present disclosure, the first transistor may be used as the access transistor of a dynamic memory. In this way, one of the source and the drain of the first transistor needs to be electrically connected with a capacitor, that is, the top of the semiconductor pillar 01 needs to be electrically connected with the capacitor. The covering layer 20 is made of an insulating material, so that unnecessary electrical connections may be avoided, thereby avoiding short circuit. Then, a plurality of through holes may be formed on the covering layer 20, the position of each through hole corresponds to one semiconductor pillar 01, and the through hole may expose the top of the semiconductor pillar 01. A part of an electrode plate of the capacitor may be formed by covering the inner wall of the through hole, so that the top of the semiconductor pillar 01 is electrically connected with the capacitor. Since the material of the covering layer 20 includes the boron-containing compound, the covering layer 20 is easier to be etched than the common insulating dielectric layers (such as silicon nitride, silicon oxide, etc.), and the internal structure of the through hole is more likely to show an isotropic etching result. Here, isotropy means that the etching direction may be performed in all directions, not only in a single direction. That is, for the through hole showing the isotropic etching result, the cross-sectional profile of the inner wall of the through hole may not only include straight lines, but irregular lines such as arcs, so that the area of the inner wall of the through hole may be larger. In this way, on the one hand, the contact area between the capacitor and the semiconductor pillar 01 may be increased, and the contact resistance may be reduced, and on the other hand, the surface area of the electrode plate of the capacitor be increased, and the capacitance may be increased. FIGS. 2 and 3 illustrate an optional embodiment of a through hole formed on a covering layer 20 in FIG. 1. Herein, FIG. 3 is a top view, and FIG. 2 is a cross-sectional view cut along a cross-sectional line A-A1 in FIG. 3. It is to be noted that the first direction X and the second direction Y shown in FIG. 3 are both perpendicular to the vertical direction Z shown in FIGS. 1 and 2. The first direction X and the second direction Y may be perpendicular to each other, and may also be at any included angle, and the following is exemplarily illustrated in a case where the first direction X is perpendicular to the second direction Y.

In some embodiments of the present disclosure, a first interconnecting hole 201 extending in the vertical direction Z is formed on the covering layer 31. A lower electrode plate of the capacitor may be formed in the first interconnecting hole 201, and is electrically connected with the semiconductor pillar 01.

In the embodiment of the present disclosure, referring to FIG. 2, the first interconnecting hole 201 may expose the top of the semiconductor pillar 01 and part of the sidewall close to the top. In this way, the contact area between the semiconductor pillar 01 and the subsequently formed contact electrodes is increased, thereby reducing the contact resistance and improving the electrical performance.

In the embodiment of the present disclosure, referring to FIG. 2, the middle aperture of the interconnecting hole 201 is larger than the top aperture or bottom aperture thereof. It is to be noted that the middle of the first interconnecting hole 201 refers to an area between the top and bottom thereof. Since the lower electrode plate of the capacitor may be formed in the first interconnecting hole 201, the top aperture or bottom thereof is too large, the capacitor is not easily protected, and the risk of short circuit is large. Therefore, the top aperture or bottom aperture of the first interconnecting hole 201 may not be too large. Then, the middle aperture of the first interconnecting hole 201 is increased, so that the middle aperture is larger than the top aperture or bottom aperture thereof. In this way, on the one hand, the risk of short circuit is not increased, and on the other hand, the surface area of the electrode plate of the capacitor is increased, and the capacitance is increased.

Figure 4:
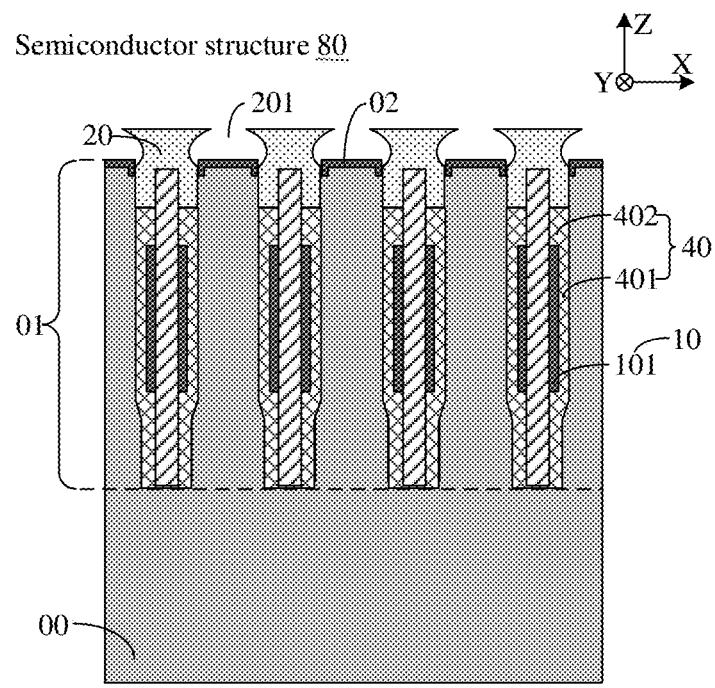
FIG. 4 is a schematic diagram IV of a semiconductor structure provided by an embodiment of the present disclosure.

In some embodiments of the present disclosure, as shown in FIG. 4, the top of each semiconductor pillar 01 is provided with a contact part 02, the contact part 02 covers the top and part of the sidewall of the semiconductor pillar 01, and the contact part 02 is configured to be in contact with the capacitor. The semiconductor pillar 01 is in electrical contact with the capacitor through the contact part 02, which is equivalent to increasing the electrical contact area between the semiconductor pillar 01 and the capacitor, thereby reducing the contact resistance between the semiconductor pillar 01 and the capacitor. The covering layer 20 isolates the adjacent semiconductor pillars 01, the covering layer 20 isolates the adjacent contact parts 02, and the covering layer 20 is made of an insulating material, so that an insulating arrangement is achieved between the discrete semiconductor pillars 01, and the contact part 02 disposed on each semiconductor pillar 01 also achieves the insulating arrangement. The covering layer 20 may form the larger through hole, so that the contact area between the contact part 02 and the subsequently formed capacitor may be increased, thereby further reducing the contact resistance and improving the performance of a semiconductor device.

The height of the sidewall of the semiconductor pillar 01 covered by the contact part 02 is $1/12$-$1/8$ of the height of the semiconductor pillar 01. Such a height setting may ensure that the contact part 02 and the top surface of the gate structure 10 have a sufficient safety distance, the generation of parasitic resistance between the gate structure 10 and the side of the contact part is reduced, and the conductivity of the semiconductor pillar 01 is increased at the same time.

In some embodiments of the present disclosure, referring to FIG. 1, the material of the covering layer includes a silicon boron material.

In some embodiments of the present disclosure, the silicon boron material is silicon boron nitride $SiB_xN_y$. Herein, $y-x \leq 2$. Here, $4 \geq y > x > 0$. It is to be noted that the representation method of $SiB_xN_y$ does not mean that the number of the silicon atoms is 1.

In some embodiments of the present disclosure, the boron silicon material is BPSG or boro silicate glass.

Compared with general materials, the etching rate of the silicon boron materials such as silicon boron nitride, BPSG or boro silicate glass is higher, that is, the silicon boron material is easier to be etched. Therefore, the covering layer 20 made of the silicon boron material is adopted, which is easier to form the through hole with a larger area of the inner wall. Thus, on the one hand, the contact area between the capacitor and the semiconductor pillar 01 may be increased, and the contact resistance may be reduced, and on the other hand, the surface area of the electrode plate of the capacitor be increased, and the capacitance may be increased.

In some embodiments of the present disclosure, referring to FIG. 1, the top of the gate-all-around structure 101 is lower than the top of the semiconductor pillar 01. A second part 402 of the dielectric layer 40 covers the top of the gate-all-around structure 101 and is disposed between the gate-all-around structure 101 and the covering layer 20. The thickness of the second part 402 of the dielectric layer 40 is greater than that of the first part 401 of the dielectric layer 40.

Figure 5:
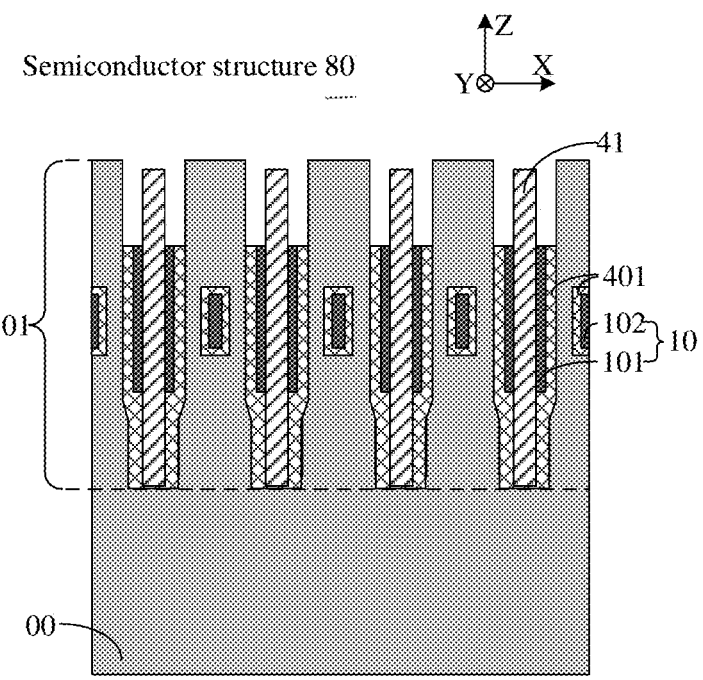
FIG. 5 is a schematic diagram V of a semiconductor structure provided by an embodiment of the present disclosure.
Figure 6:
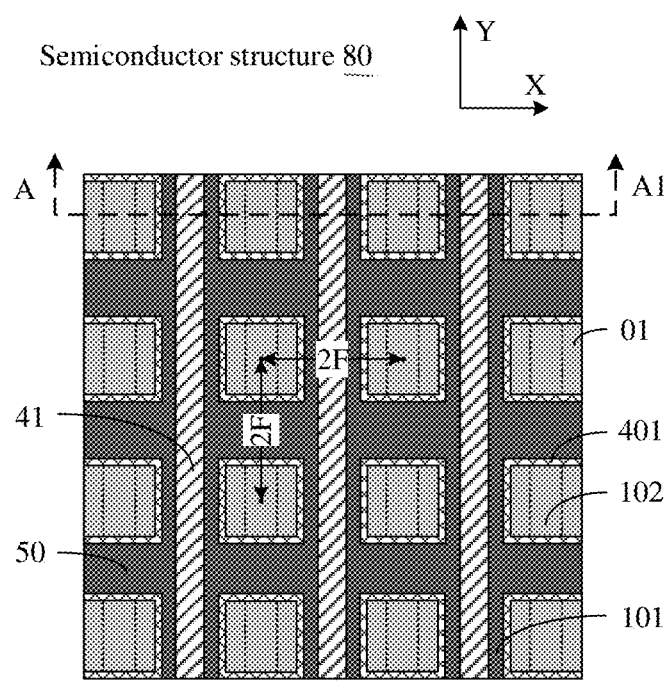
FIG. 6 is a schematic diagram VI of a semiconductor structure provided by an embodiment of the present disclosure.

FIGS. 5 and 6 illustrate some structures disposed below the covering layer in the semiconductor structure, FIG. 6 is a top view, and FIG. 5 is a cross-sectional view cut by a cross-sectional line A-A1 in FIG. 6.

In the embodiment of the present disclosure, referring to FIG. 6, in a top view, the size of the semiconductor pillars 01 meets $4F^2$ (F: the minimum pattern size obtainable under a given process condition), that is, the distance between the center points of the two adjacent semiconductor pillars 01 in the first direction X is 2F, and at the same time, the distance between the center points of the two adjacent semiconductor pillars 01 in the second direction Y is also 2F. Therefore, the integration density of the semiconductor structure 80 is improved. In some embodiments, when storage units are formed on the semiconductor pillar 01, the storage units may also be disposed according to $4F^2$.

In some embodiments of the present disclosure, referring to FIGS. 5 and 6, the gate structure 10 further includes at least one bridge gate structure 102. The at least one bridge gate structure 102 penetrates through the semiconductor pillar 01 and extends to the inner wall of the gate-all-around structure 101 in the penetrating direction. The at least one bridge gate structure 102 is disposed in the semiconductor pillar 01 and is disposed corresponding to the middle area of the gate-all-around structure 101. In some embodiments of the present disclosure, referring to FIGS. 5 and 6, the width of the bridge gate structure 102 is less than that of the semiconductor pillar 01. The width of the bridge gate structure 102 and the width of the semiconductor pillar 01 are the distances in the direction X.

In the embodiment of the present disclosure, in combination with FIGS. 5 and 6, the bridge gate structure 102 of the gate-all-around structure 101 penetrates through the semiconductor pillar 01 and extends to the inner wall of the gate-all-around structure 101 in the penetrating direction (i.e. the second direction Y), the semiconductor pillar 01 is penetrated to form a through hole, which is filled with the bridge gate structure 102, that is, the inner wall of the through hole is covered with the bridge gate structure 102. In this way, the bridge gate structure 102 covers part of the channel, the coverage area of the channel by the gate structure 10 is increased, and the channel is more easily controlled, thereby further improving the control ability of the gate of the formed first transistor.

In some embodiments of the present disclosure, as shown in FIGS. 5 and 6, the semiconductor structure 80 further includes: a first isolation layer 41. The first isolation layer 41 is disposed between the adjacent semiconductor pillars 01, and the gate structure 10 is disposed between the first isolation layer 41 and the semiconductor pillar 01.

In the embodiment of the present disclosure, the first isolation layer 41 extends in the second direction Y to isolate the adjacent semiconductor pillars 01. In addition, the gate structures 10 disposed in the second direction Y are connected to each other to form a word line extending in the direction Y, and the first isolation layer 41 is also configured to isolate the adjacent word lines 50. The material of the first isolation layer 41 may be silicon nitride (SiN).

It is can be understood that, since the gate structure 10 is a part of the word line 50, that is, the word line 50 is in contact with the semiconductor pillar 01 through the gate structure 10. Due to the arrangement of the gate-all-around structure 101 and the bridge gate structure 102, the contact area between the gate structure 10 and the semiconductor pillar 01 is increased. Therefore, the contact area between the word line 50 and the semiconductor pillar 01 is increased, and the contact resistance between the word line 50 and the semiconductor pillar 01 is reduced, thereby improving the electrical stability of the word line 50 and improving the control ability of the word line 50 to the first transistor.

Figure 7:
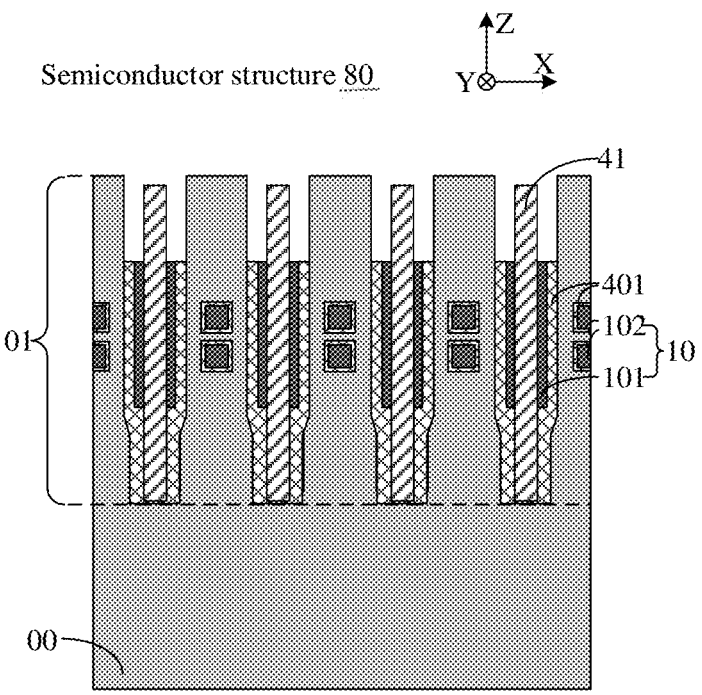
FIG. 7 is a schematic diagram VII of a semiconductor structure provided by an embodiment of the present disclosure.

FIG. 7 illustrates a cross-sectional view of the semiconductor structure 80 in a case where the number of bridge gate structures 102 is two.

In some embodiments of the present disclosure, as shown in FIG. 7, the gate structure 10 further includes at least two bridge gate structures 102. The at least two bridge gate structures 102 are stacked at an interval in the vertical direction Z, and the at least two bridge gate structures 102 are isolated directly by the semiconductor pillar.

It can be understood that, each bridge gate structure 102 covers the inner wall of one through hole on the semiconductor pillar 01, that is, covers a part of the channel, and the coverage area of the channel may be increased using the at least two bridge gate structures 102, thereby increasing the control ability of the gate of the formed first transistor.

In the embodiment of the present disclosure, referring to FIG. 7, the width of each bridge gate structure 102 is smaller than that of the semiconductor pillar 01. The semiconductor pillar 01 is penetrated by the bridge gate structure 102, and the bridge gate structure 102 covers the inner wall of the through hole, so that the contact area between the gate structure 10 and the semiconductor pillar 01 is increased, the control ability of the gate structure 10 to the semiconductor pillar 01 is also increased, and the contact resistance between the gate structure 10 and the semiconductor pillar 01 is reduced.

Figure 8:
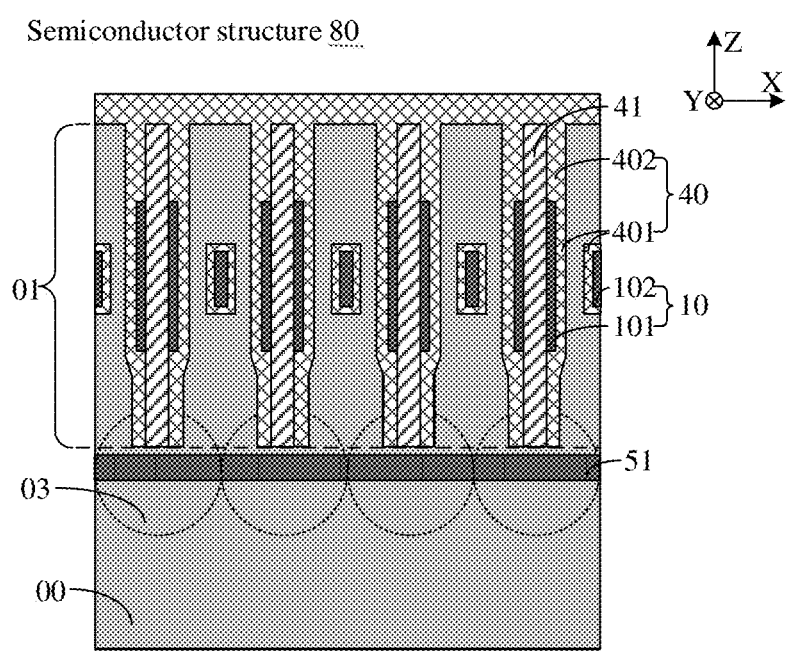
FIG. 8 is a schematic diagram VIII of a semiconductor structure provided by an embodiment of the present disclosure.

In some embodiments of the present disclosure, as shown in FIG. 8, the semiconductor structure 80 further includes: a bit line 51. The bit line 51 is disposed in the base 00, and the bottom of the semiconductor pillar 01 is electrically connected with the bit line 51.

Figure 9:
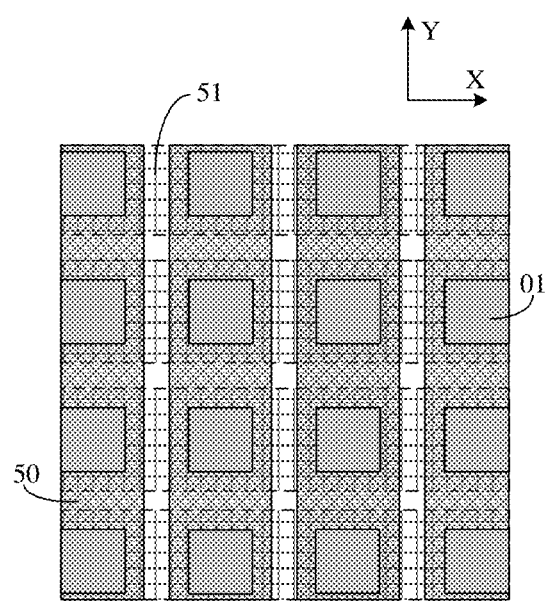
FIG. 9 is a schematic diagram IX of a semiconductor structure provided by an embodiment of the present disclosure.

In the embodiment of the present disclosure, FIG. 8 is a cross-sectional view, and FIG. 9 illustrates a positional relationship between the word line 50 and the bit line 51 in a top view. In combination with FIGS. 8 and 9, the bit line 51 extends in the first direction X, and the word line 50 extends in the second direction Y. The word line 50 is disposed above the bit line 51. In FIG. 9, the edge of the word line 50 is represented by a solid line, the edge of the bit line 51 is represented by a dotted line, and the bit line 51 is partially shielded by the word line 50. In a top view, the word line 50 and the bit line 51 intersect (but are not directly electrically connected), and the intersection is disposed at the position of the semiconductor pillar 01.

Referring to FIG. 8, the base 00 may further include a metal silicide structure 03 (an area surrounded by a circular dotted line frame). The metal silicide structures 03 are connected to each other in the first direction X to form the bit line 51. The bit line 51 is electrically connected with the bottom of the semiconductor pillar 01.

In the embodiment of the present disclosure, the material of the metal silicide structure 03 includes at least one of cobalt silicide, nickel silicide, molybdenum silicide, titanium silicide, tungsten silicide, tantalum silicide, or platinum silicide.

It can be understood that, compared with an un-metallized semiconductor material, the metal silicide structure 03 has a relatively small resistivity, which is beneficial to reduce the resistance of the bit line 51 and reduce the contact resistance between the bit line 51 and the semiconductor pillar 01, thereby further improving the electrical performance of the semiconductor structure 80.

Figure 10:
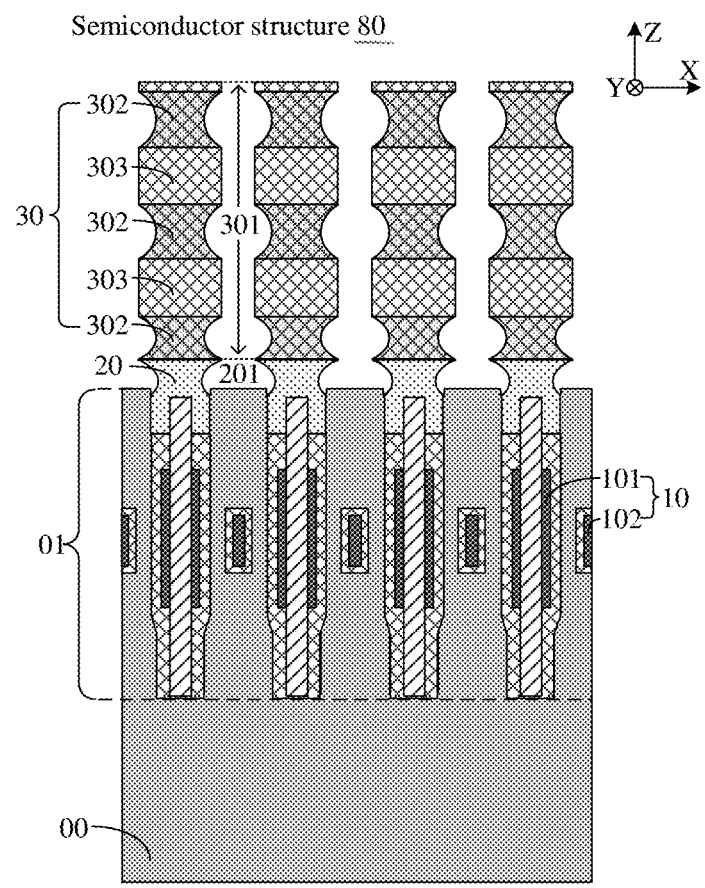
FIG. 10 is a schematic diagram X of a semiconductor structure provided by an embodiment of the present disclosure.

In some embodiments of the present disclosure, as shown in FIG. 10, the semiconductor structure 80 further includes: a sacrificial structure 30 disposed above the covering layer 20. The sacrificial structure 30 includes an additional doping area 302 and a body area 303 which are alternately disposed in the vertical direction Z. The doping concentration in the additional doping area 302 is higher than the doping concentration in the body area 303. For example, if the material of the sacrificial structure 30 is BPSG doped with the boron element, the boron content in the additional doping area 302 is higher than the boron content in the body area 303. Of course, in some embodiments, the body area 303 may also be un-doped BPSG.

In the embodiment of the present disclosure, an Ion Implantation (IMP) process may be used to dope the sacrificial structure 30 to form the additional doping area 302. IMP is controlled by adopting different energies, so that areas with different depths in the sacrificial structure 30 may be doped, thereby forming the alternately disposed additional doping area 302 and body area 303.

In some embodiments of the present disclosure, as shown in FIG. 10, the sacrificial structure 30 may be processed to form a second through hole 301. In the subsequent process, the capacitor may be formed in the second through hole 301, and the capacitor is electrically connected to the semiconductor pillar 01.

In the embodiment of the present disclosure, the second through hole 301 is formed by etching according to a mask. Since the doping concentration of the boron in the additional doping area 302 is higher than the doping concentration in the body area 303, the additional doping area 302 is easier to be etched than the body area 303, and the additional doping area 302 is easier to form an isotropic etched structure. Referring to FIG. 7, the aperture of the second through hole 301 in the additional doping area 302 is larger than that in the body area 303, so that the cross-sectional profile of the inner sidewall of the second through hole 301 is wavy.

It can be understood that, since the electrode plate of the capacitor formed in the second through hole 301 covers the inner sidewall of the second through hole 301, the inner sidewall of the second through hole 301 with the wavy cross-sectional profile may increase the area of the electrode plate of the capacitor, thereby increasing the capacity of the capacitor. At the same time, the first interconnecting hole 201 may expose the top of the semiconductor pillar 01 and part of the sidewall close to the top, so that the contact area between the semiconductor pillar 01 and the capacitor is increased, thereby reducing the contact resistance and improving the electrical performance.

The embodiments of the present disclosure further provide a method for manufacturing a semiconductor structure, which includes S101 to S104 and may be described in combination with each step.

It is to be noted that, FIGS. 11 to 20 are partial structural diagrams of a semiconductor structure in each step, which are configured to describe and clearly illustrate the steps of the method for manufacturing the semiconductor structure. A first direction X and a second direction Y shown in FIGS. 11 to 20 are both perpendicular to the vertical direction Z. The first direction X and the second direction Y may be perpendicular to each other, and may also be at any included angle, and the following is exemplarily illustrated in a case where the first direction X is perpendicular to the second direction Y.

At S101, a base is provided, the base is patterned, and discrete semiconductor pillars are formed on the base.

Figure 11:
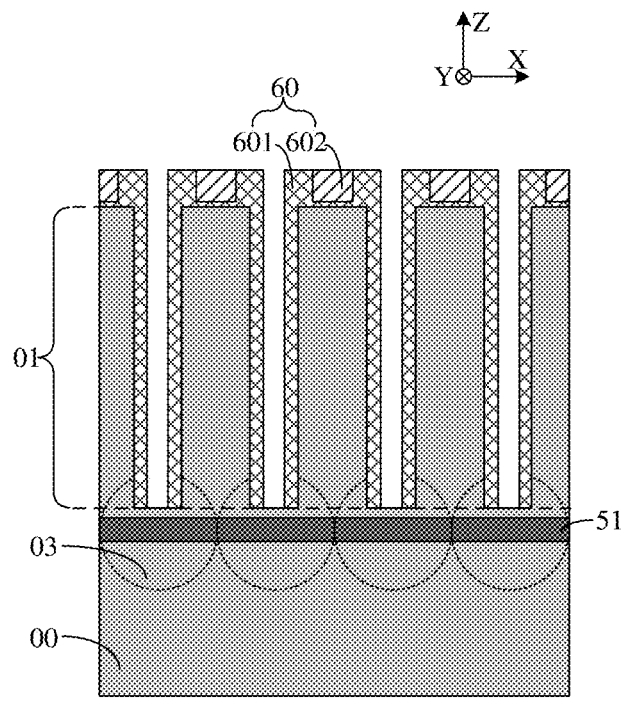
FIG. 11 is a schematic diagram I of a method for manufacturing a semiconductor structure provided by an embodiment of the present disclosure.

In the embodiment of the present disclosure, as shown in FIG. 11, after the base 00 is patterned, the discrete semiconductor pillars 01 are formed. The semiconductor pillars 01 are disposed at the top of the base 00 and extend in a vertical direction Z. The base 00 may include at least one of semiconductor materials, for example, group IV elements such as silicon (Si), germanium (Ge), and silicon germanium (SiGe), or group III-V components such as gallium arsenide (GaAs), aluminum gallium arsenide (AlGaAs), indium arsenide (InAs), or indium gallium arsenide (InGaAs), and the following is exemplarily illustrated with the silicon element included in the base 00.

The semiconductor pillar 01 may have a doping element to improve the conductivity of the semiconductor pillar01. Herein, the doping element may be a P-type doping element or an N-type doping element, and the N-type doping element may be at least one of an arsenic (As) element, a phosphorus (P) element, or an antimony (Sb) element. The P-type doping element may be at least one of a boron (B) element, an indium (In) element, or a gallium (Ga) element.

In the embodiment of the present disclosure, referring to FIG. 11, the base 00 is further provided with a bit line 51, and the bit line 51 extends in the first direction X. The base 00 further includes a metal silicide structure 03 (an area surrounded by a circular dotted line frame). The metal silicide structures 03 are connected to form the bit line 51. The bottom of the semiconductor pillar 01 is electrically connected with the bit line 51. The material of the metal silicide structure 03 includes at least one of cobalt silicide, nickel silicide, molybdenum silicide, titanium silicide, tungsten silicide, tantalum silicide, or platinum silicide.

Referring to FIG. 11, the semiconductor pillar 01 is also covered with a mask layer 60, a first part 601 of the mask layer 60 covers the sidewall and the top of the semiconductor pillar 01, and the middle of the first part 601 is filled with a second part 602 of the mask layer 60. The materials of the first part 601 and the second part 602 of the mask layer 60 are different, for example, the material of the first part 601 is silicon oxide, and the material of the second part 602 is silicon nitride. In this way, in combination with FIGS. 12 and 13, etching may be performed according to a certain selection ratio, only the second part 602 and part of the semiconductor channel 01 covered therewith are removed, and a groove 61 is formed in the middle of the semiconductor channel 01.

Figure 14:
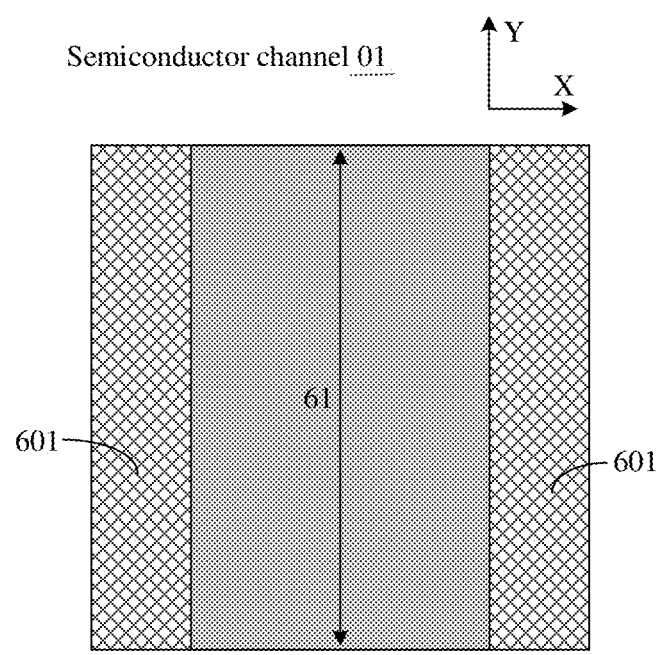
FIG. 14 is a schematic diagram IV of a method for manufacturing a semiconductor structure provided by an embodiment of the present disclosure.

FIG. 14 is a top view of the single semiconductor pillar 01. As shown in FIG. 14, the groove 61 extends in the second direction Y and penetrates through the semiconductor pillar 01.

Figure 12:
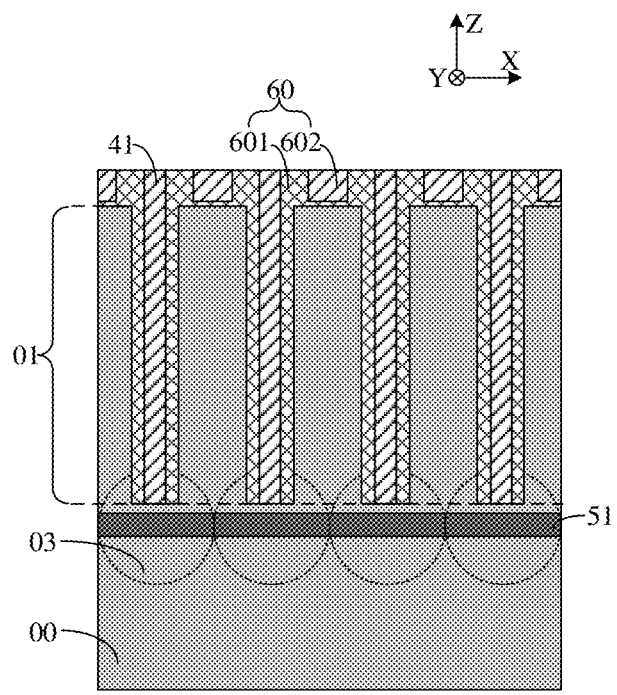
FIG. 12 is a schematic diagram II of a method for manufacturing a semiconductor structure provided by an embodiment of the present disclosure.

In the embodiment of the present disclosure, referring to FIG. 12, before the groove is formed by etching, a first isolation layer 41 may be deposited. The first isolation layer 41 extends in the second direction Y to isolate the adjacent semiconductor pillars 01. The material of the first isolation layer 41 may be silicon nitride.

Figure 13:
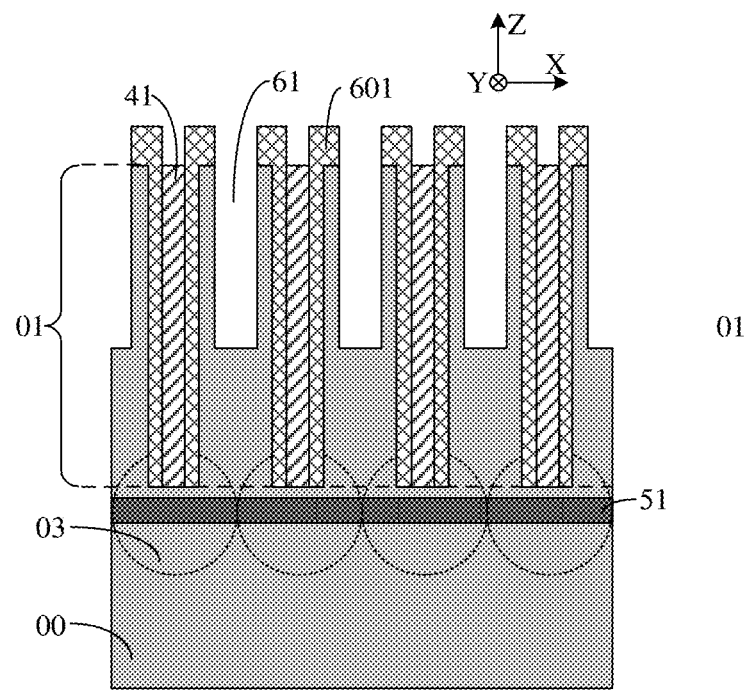
FIG. 13 is a schematic diagram III of a method for manufacturing a semiconductor structure provided by an embodiment of the present disclosure.
Figure 15:
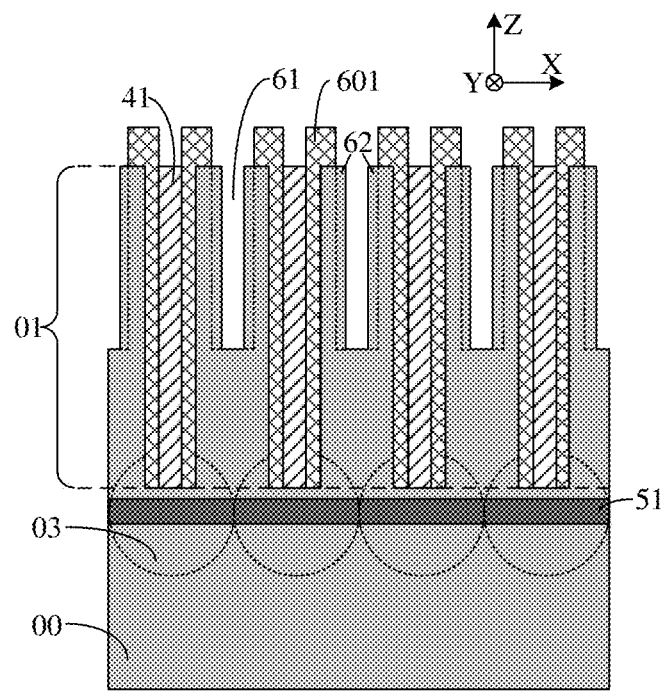
FIG. 15 is a schematic diagram V of a method for manufacturing a semiconductor structure provided by an embodiment of the present disclosure.

In the embodiment of the present disclosure, in combination with FIGS. 13 and 15, after the groove 61 is formed by etching, an epitaxial layer 62 may be formed in the inner wall of the groove 61 to reduce the width of the groove 61, and repair the defects of the inner wall of the groove 61.

Figure 16:
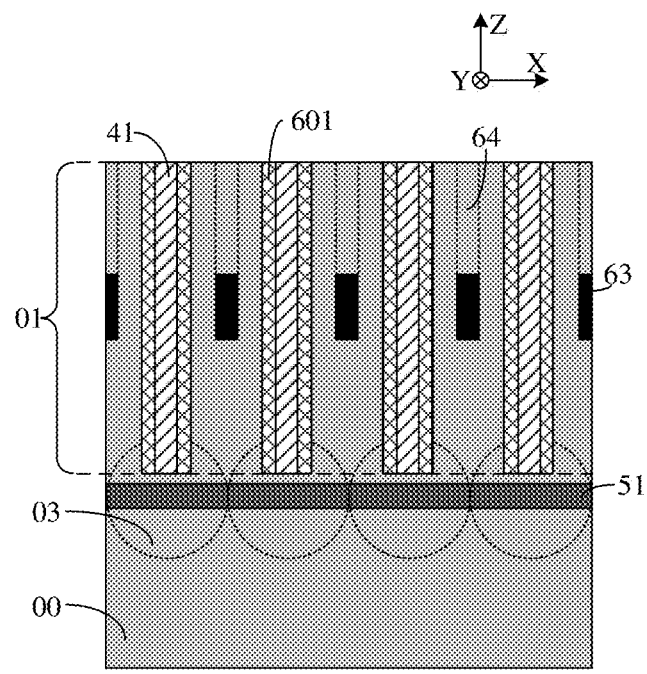
FIG. 16 is a schematic diagram VI of a method for manufacturing a semiconductor structure provided by an embodiment of the present disclosure.

In the embodiment of the present disclosure, in combination with FIGS. 15 and 16, after the groove 61 is formed, a sacrificial layer 63 may be formed in the groove 61. The height of the sacrificial layer 63 is ⅓-½ of the height of the groove 61. The material of the sacrificial layer 63 may be silicon germanium (SiGe), which is easily removed in the subsequent process, and provides a basis for forming a bridge gate structure in the gate structure in the subsequent process. Then, referring to FIG. 16, a filling layer 64 may be formed in the groove 61, the filling layer 64 is disposed on the sacrificial layer 63, and the remaining groove 61 is filled with the filling layer 64.

Figure 17:
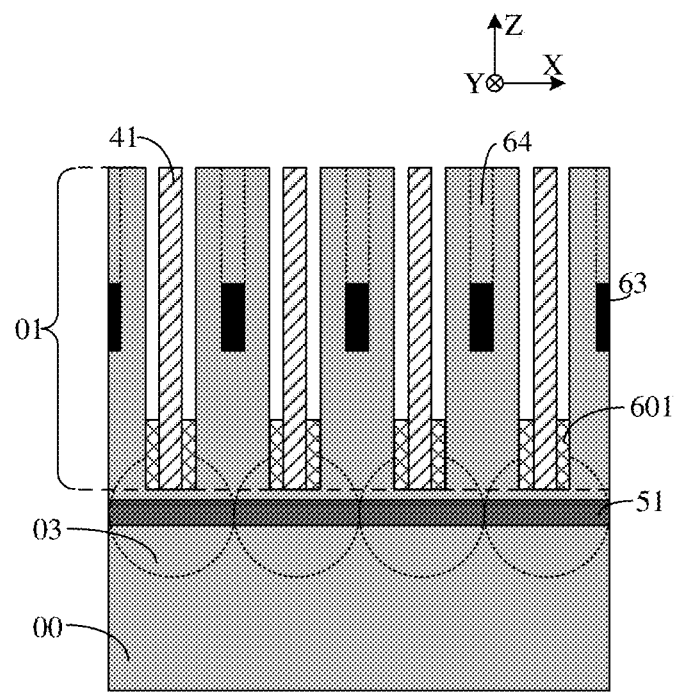
FIG. 17 is a schematic diagram VII of a method for manufacturing a semiconductor structure provided by an embodiment of the present disclosure.

In the embodiment of the present disclosure, in combination with FIGS. 12 and 17, the part, covering the sidewall of the semiconductor pillar 01, of the first part 601 of the mask layer 60 may be etched to the bottom area of the semiconductor pillar 01. As shown in 17, in this way, the remaining first part 601 may protect the sidewall, close to the bottom, of the semiconductor pillar 01 may be protected to avoid subsequent short circuit between the word line and the bit line.

At S102, a dielectric layer is formed.

Figure 18:
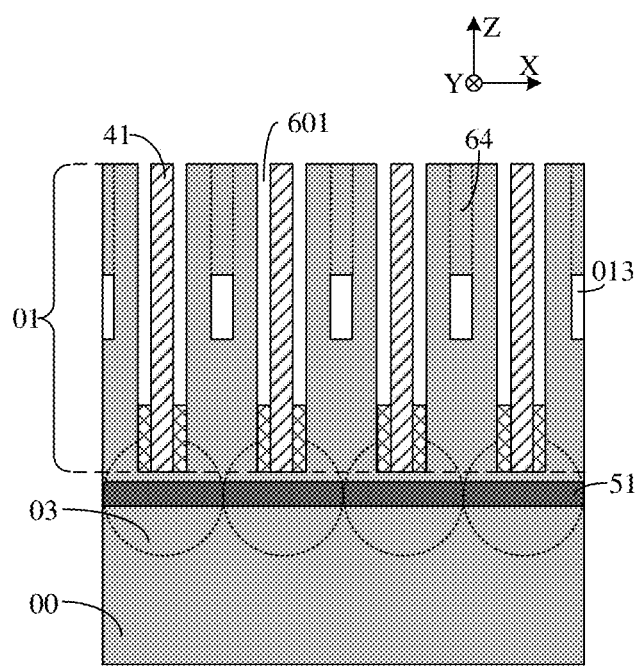
FIG. 18 is a schematic diagram VIII of a method for manufacturing a semiconductor structure provided by an embodiment of the present disclosure.

In the embodiment of the present disclosure, referring to FIGS. 17 and 18, a wet etch process is adopted to remove the sacrificial layer 63 filled in the semiconductor pillar 01, so as to form the through hole 013 in FIG. 18.

Figure 19:
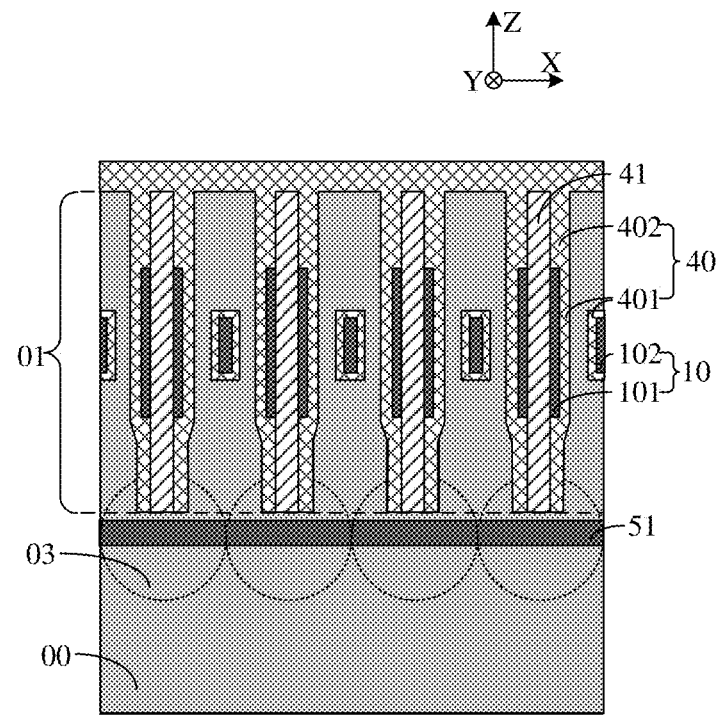
FIG. 19 is a schematic diagram IX of a method for manufacturing a semiconductor structure provided by an embodiment of the present disclosure.

In the embodiment of the present disclosure, referring to FIGS. 18 and 19, after the through hole 013 is formed, a Chemical Vapor Deposition (CVD) process may be adopted to form a first initial dielectric layer on the sidewall of the middle area of the semiconductor pillar 01 and the inner wall of the through hole 013. Herein, the part of the first initial dielectric layer covering the semiconductor pillar 01 with reduced size forms a first part 401 of the dielectric layer 40, and there is a gap between the first part 401 of the dielectric layer 40 and the first isolation layer 41 to form the gate layer of a gate-all-around structure 101.

Then, in combination with FIGS. 18 and 19, after the gate-all-around structure 101 is formed, a second initial dielectric layer may be deposited. The part of the second initial dielectric layer covering the top of the gate-all-around structure 101 forms a second part 402 of the dielectric layer 40. In this way, the dielectric layer 40 is formed. The dielectric layer 40 covers the sidewall of the semiconductor pillar 01. The thickness of the second part 402 of the dielectric layer 40 is greater than that of the first part 401 of the dielectric layer 40.

At S103, a gate structure is formed in the middle area of the semiconductor pillar.

In the embodiment of the present disclosure, in combination with FIGS. 18 and 19, after the first initial dielectric layer is formed, the gate layer is formed around the sidewall of the first initial dielectric layer through filling the through hole 103. Herein, the part of the gate layer for filling the through hole 013 forms a bridge gate structure 102. The material of the gate structure may be conductive materials such as titanium nitride, polycrystalline silicon, or tungsten. The sidewall of the first initial dielectric layer may be covered with the gate layer, and then the part of the gate layer around the sidewall of the first initial dielectric layer may be etched back. The gate layer remaining after the etchback forms the gate-all-around structure 101. In this way, the gate structure 10 including the gate-all-around structure 101 and the bridge gate structure 102 is formed. Herein, the gate-all-around structure 101 surrounds the semiconductor pillar 01, and the bridge gate structure 102 penetrates through the semiconductor pillar 01 and extends to the inner wall of the gate-all-around structure 101 in the penetrating direction. The first part 401 of the dielectric layer 40 is disposed between the gate structure 10 and the semiconductor pillar 01.

It can be understood that, the semiconductor pillar 01 is penetrated to form the through hole 013, which is filled with the bridge gate structure 102, that is, the inner wall of the through hole 013 is covered with the bridge gate structure 102. In this way, the coverage area of the semiconductor pillar 01 by the gate structure 10 is increased, thereby further improving the control ability of the gate of the formed transistor.

At S104, a covering layer is formed.

Figure 20:
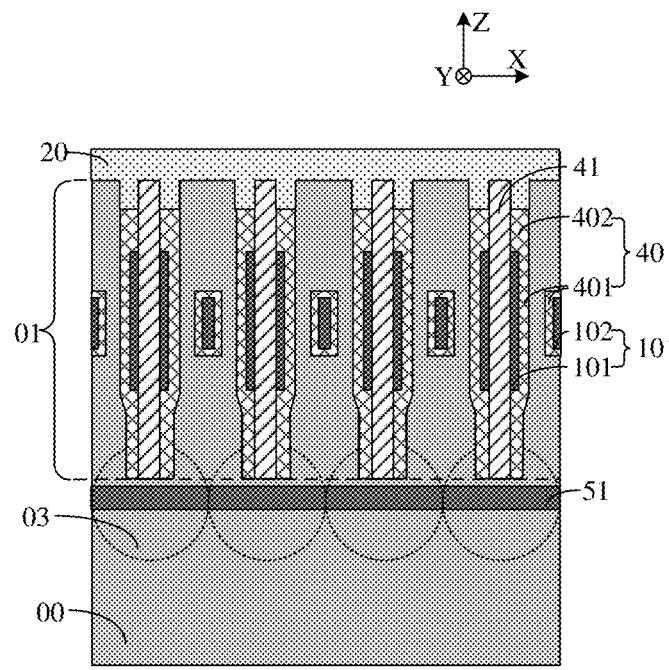
FIG. 20 is a schematic diagram X of a method for manufacturing a semiconductor structure provided by an embodiment of the present disclosure.

In the embodiment of the present disclosure, referring to FIGS. 19 and 20, first, the second part 402 of the dielectric layer 40 may be etched back, so that the top of the second part 402 of the dielectric layer 40 is lower than the top of the semiconductor pillar 01. Then, referring to FIG. 20, the covering layer 20 may be deposited. The covering layer 20 covers the top of the semiconductor pillar 01 and part of the sidewall close to the top. The material of the covering layer 20 includes a boron-containing compound, that is, the material of the covering layer 20 has a higher etching rate than general materials.

In the embodiment of the present disclosure, the material of the covering layer 20 may be silicon boron nitride SiBxNy. Herein, $4 \geq y > x > 0$, $y-x \leq 2$. In some embodiments of the present disclosure, the boron silicon nitride $SiB_xN_y$ may be SiB2N4 or SiB2·6N4. It is to be noted that the representation method of $SiB_xN_y$ does not mean that the number of the silicon atoms is 1. Compared with the general materials, the etching rate of the silicon boron nitride is higher, that is, the silicon boron nitride is easier to be etched.

In the embodiment of the present disclosure, when the silicon nitride is formed, the boron element is introduced into a cavity, thereby forming the silicon boron nitride, that is, the covering layer 20. At the same time, by controlling a flow ratio of the nitrogen atoms to the boron atoms, the ratio of the number of the boron atoms to the number of the nitrogen atoms in the silicon boron nitride may be adjusted. It is to be noted that, since the silicon boron nitride is easier to be etched than silicon nitride, and the boron atoms are doped into the silicon nitride at the same time, so that the stress of the silicon nitride may be reduced, that is, the stress of the silicon boron nitride is smaller, the internal interaction force is smaller, and the structural damage is not prone to generation, thereby improving the device performance. When the difference between the number of the nitrogen atoms and the number of the boron atoms is smaller than or equal to 2, the content of the nitrogen atoms in the silicon boron nitride may be increased, thereby increasing the etching rate of the silicon boron nitride, and the stress of the silicon boron nitride is smaller.

It can be understood that, on the one hand, since the material of the covering layer 20 has a higher etching rate than the general materials, the covering layer 20 is etched to be easier to form the through hole with a larger middle aperture, and the top of the semiconductor pillar 01 and part of the sidewall close to the top are exposed, which may refer to FIGS. 2 and 3. Therefore, for the capacitor formed in the through hole, the surface area of the electrode plate is larger, and the capacitance is larger, and at the same time, the contact area with the semiconductor pillar 01 is larger, and the contact resistance is smaller.

In some embodiments of the present disclosure, in combination with FIGS. 12 to 19, the step of forming the gate structure 10 includes S201 to S207, which may be described in combination with each step.

At S201, a groove 61 is formed in the semiconductor pillar 01.

In the embodiment of the present disclosure, as shown in FIG. 12, the semiconductor pillar 01 is also covered with a mask layer 60, a first part 601 of the mask layer 60 covers the sidewall and the top of the semiconductor pillar 01, and the middle of the first part 601 is filled with a second part 602 of the mask layer 60.

In combination with FIGS. 12 and 13, etching may be performed according to a certain selection ratio, only the second part 602 and part of the semiconductor pillar 01 covered therewith are removed, and a groove 61 is formed in the middle of the semiconductor pillar 01. FIG. 14 is a top view of the single semiconductor pillar 01. As shown in FIG. 14, the groove 61 extends in the second direction Y and penetrates through the semiconductor pillar 01.

In the embodiment of the present disclosure, in combination with FIGS. 13 and 15, after the groove 61 is formed by etching, an epitaxial layer 62 may be formed in the inner wall of the groove 61 to reduce the width of the groove 61. Since the smaller the size of a mask pattern, the greater the difficulty of the process, the etching is first performed according to the second part 602 of the wider mask layer, and then the epitaxial layer 62 is formed to reduce the width of the groove 61. In this way, a small-size groove is formed with a large-size mask pattern, which reduces the difficulty of the process. At the same time, in the process of forming the groove 61 by etching, defects and damages may be brought to the inner wall of the groove 61, and the epitaxial layer 62 may also repair the defects and damages on the inner wall of the groove 61, thereby reducing the defects of the semiconductor pillar 01 and improving the performance of the formed semiconductor structure.

At S202, a sacrificial layer 63 is formed in the groove 61.

In the embodiment of the present disclosure, in combination with FIGS. 15 and 16, after the groove 61 is formed, a sacrificial layer 63 may be formed in the groove 61. The material of the sacrificial layer 63 may be silicon germanium (SiGe), which is easily removed in the subsequent process.

At S203, a filling layer 64 is formed in the groove 61, the filling layer 64 is disposed on the sacrificial layer 63, and the remaining groove 61 is filled with the filling layer 64.

In the embodiment of the present disclosure, if a gate structure to be formed only includes one bridge gate structure, after the sacrificial layer 63 is formed, the filling layer 64 is formed in the groove 61, the filling layer 64 is disposed on the sacrificial layer 63, and the remaining grooves 61 is directly filled with the filling layer 64, as shown in FIG. 16.

If the gate structure to be formed includes at least two bridge gate structures, after the sacrificial layer 63 is formed, part of the sacrificial layer 63 is etched back to form the filling layer 64 in the groove 61, and the filling layer 64 is disposed on the remaining sacrificial layer 63. That is, after one filling layer 64 is formed on the sacrificial layer 63, the sacrificial layer 63 and the filling layer 64 are formed in the groove 61 in sequence, and finally the top of the groove 61 is filled with the filling layer 64.

It can be understood that the sacrificial layer 63 and the filling layer 64 are formed in the groove 61 in sequence, which provides a basis for forming the bridge gate structure in the gate structure in the subsequent process.

At S204, the sacrificial layer 63 is removed to form a through hole 013.

In the embodiment of the present disclosure, referring to FIGS. 17 and 18, a wet etch process is adopted to remove the sacrificial layer 63 filled in the semiconductor pillar 01, so as to form the through hole 013 in FIG. 18. The through hole 013 penetrates through the semiconductor pillar 01 in the second direction Y.

At S205, a first initial dielectric layer is formed on the sidewall of the semiconductor pillar 01 and the inner wall of the through hole 013.

In the embodiment of the present disclosure, in combination with FIGS. 18 and 19, after the through hole 013 is formed, a CVD process may be adopted to form the first initial dielectric layer on the sidewall of the middle area of the semiconductor pillar 01 and the inner wall of the through hole 013. Herein, the part, disposed in the middle area, of the first initial dielectric layer forms the first part 401 of the dielectric layer 40, and the first part 401 of the dielectric layer 40 is disposed between the gate structure 10 and the semiconductor pillar 01. The material of the first initial dielectric layer may be silicon oxide.

At S206, a gate layer is formed around the sidewall of the first initial dielectric layer through filling the through hole 013. Herein, the part of the gate layer for filling the through hole 013 forms a bridge gate structure 102.

In the embodiment of the present disclosure, in combination with FIGS. 18 and 19, after the first initial dielectric layer is formed, the gate layer is formed around the sidewall of the first initial dielectric layer through filling the through hole 103. Herein, the part of the gate layer for filling the through hole 013 forms a bridge gate structure 102. The material of the gate structure may be conductive materials such as titanium nitride.

At S207, the part of the gate layer around the sidewall of the first initial dielectric layer is etched to form a gate-all-around structure 101.

In the embodiment of the present disclosure, referring to FIG. 19, after the gate layer is formed, the part of the gate layer around the sidewall of the first initial dielectric layer may be etched back, and the gate layer remaining after the etchback forms the gate-all-around structure 101. In this way, the gate structure 10 including the gate-all-around structure 101 and the bridge gate structure 102 is formed.

It can be understood that, the gate structure 10 includes the gate-all-around structure 101 and the bridge gate structure 102, and the coverage area of the semiconductor pillar 01 is increased, thereby further improving the control ability of the gate of the formed transistor.

In the embodiment of the present disclosure, in combination with FIGS. 18 to 19, before the first initial dielectric layer is formed, the method for manufacturing the semiconductor structure further includes S208, which may be illustrated in combination with each step.

At S208, part of the sidewall of the semiconductor pillar 01 is etched, so that the width of the middle area of the semiconductor pillar 01 is smaller than the width of the bottom of the semiconductor pillar 01.

In the embodiment of the present disclosure, before the first initial dielectric layer is formed, the area of the semiconductor pillar 01 not covered with the mask layer 601 in FIG. 18 and part of the sidewall above the bottom of the semiconductor pillar 01 may be etched (for example, dry etch), so that the width of the middle area of the semiconductor pillar 01 is smaller than the width of the bottom of the semiconductor pillar 01, thereby providing a larger space for the subsequent formation of the gate structure. The above width may be the width in the first direction X.

In the embodiment of the present disclosure, in combination with FIGS. 19 to 20, the step of forming the covering layer 20 includes S301 to S303, which may be illustrated in combination with each step.

At S301, a second initial dielectric layer is formed on the gate structure 10 and the semiconductor pillar 01.

In the embodiment of the present disclosure, referring to FIG. 19, after the gate structure 10 is formed, the second initial dielectric layer may be deposited on the gate structure 10 and the semiconductor pillar 01.

At S302, the second initial dielectric layer is etched until the top of the semiconductor pillar 01 and part of the sidewall close to the top are exposed.

In the embodiment of the present disclosure, in combination with FIGS. 19 and 20, after the initial dielectric layer is deposited, the second initial dielectric layer may be etched until the top of the semiconductor pillar 01 and part of the sidewall close to the top are exposed, and the remaining second initial dielectric layer forms the second part 402 of the dielectric layer 40.

At S303, the top of the semiconductor pillar 01 and part of the sidewall close to the top are covered to form the covering layer 20.

In the embodiment of the present disclosure, referring to FIG. 20, after the top of the semiconductor pillar 01 and part of the sidewall close to the top are exposed, the top of the semiconductor pillar 01 and part of the sidewall close to the top may be covered to deposit the covering layer 20. The material of the covering layer 20 includes a boron-containing compound, that is, the material of the covering layer 20 has a higher etching rate than general materials.

In some embodiments of the present disclosure, referring to FIGS. 19 and 21 to 25, before the covering layer 20 is formed, a contact part 02 may also be formed on the top surface of the semiconductor pillar 01 and the side surface close to the top surface.

Figure 21:
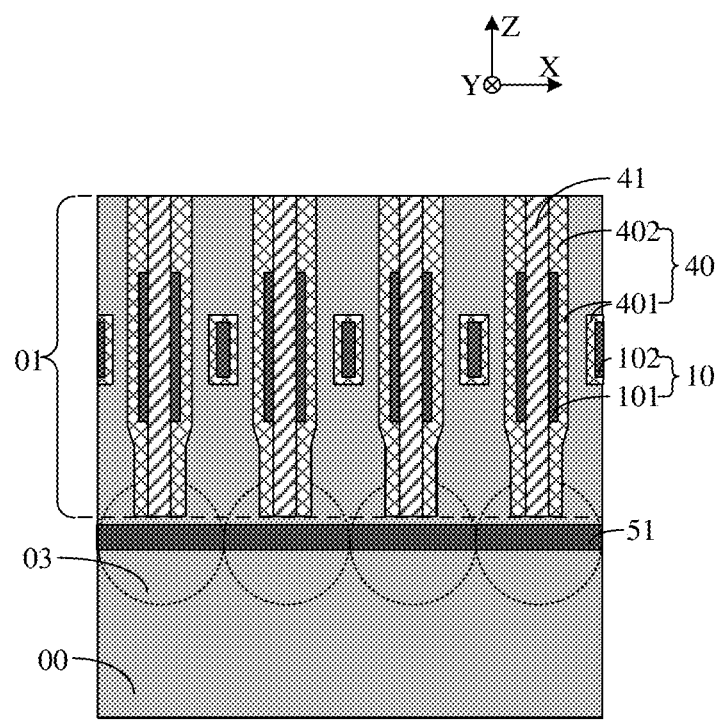
FIG. 21 is a schematic diagram XI of a method for manufacturing a semiconductor structure provided by an embodiment of the present disclosure.

Referring to FIGS. 19 and 21, after the dielectric layer 40 is formed, a Wet Etch process or a Dry Etch process may be adopted to remove part of the dielectric layer 40 on the top of the semiconductor pillar 01 to expose the semiconductor pillar 01, so that the second part 402 of the remaining dielectric layer 40 is flush with the top of the semiconductor pillar 01.

Figure 22:
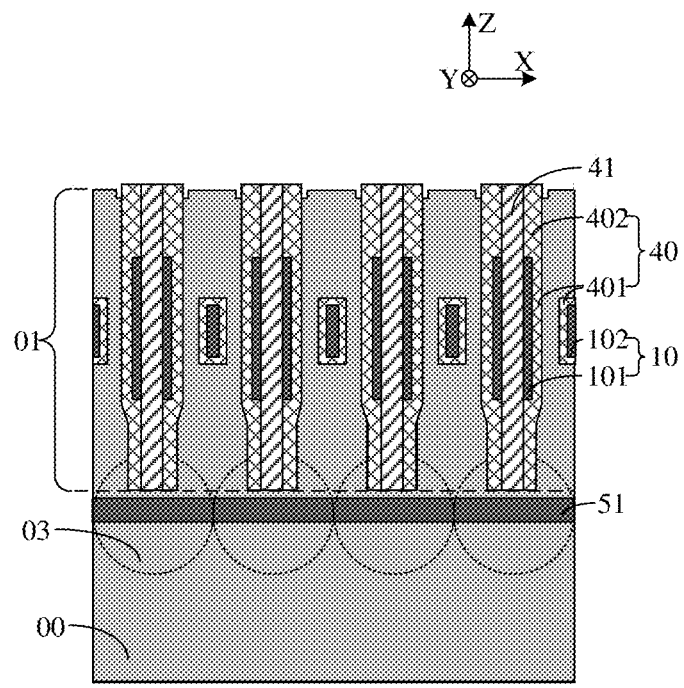
FIG. 22 is a schematic diagram XII of a method for manufacturing a semiconductor structure provided by an embodiment of the present disclosure.

Then, referring to FIGS. 21 and 22, the wet etch process may be adopted to remove part of the top of the semiconductor pillar 01, so that the top end surface of the semiconductor pillar 01 is lower than the top end surfaces of the dielectric layer 40 and the first isolation layer 41. Herein, the removal height of the semiconductor pillar 01 is $\frac{1}{12}$-$\frac{1}{8}$ of the remaining semiconductor pillar.

Figure 23:
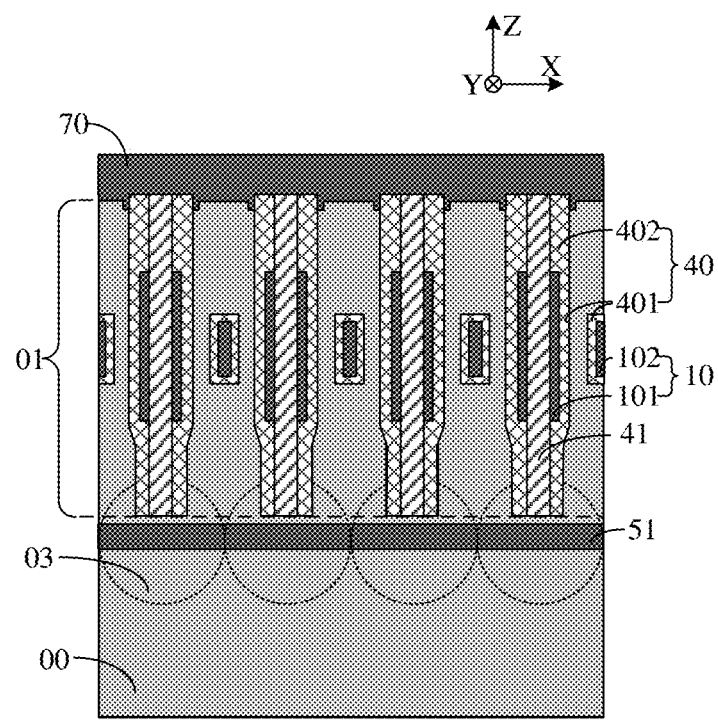
FIG. 23 is a schematic diagram XIII of a method for manufacturing a semiconductor structure provided by an embodiment of the present disclosure.

Then, referring to FIGS. 22 and 23, the top ends of the semiconductor pillar 01, the dielectric layer 40 and the first isolation layer 41 may be covered with a conductive layer 70.

Figure 24:
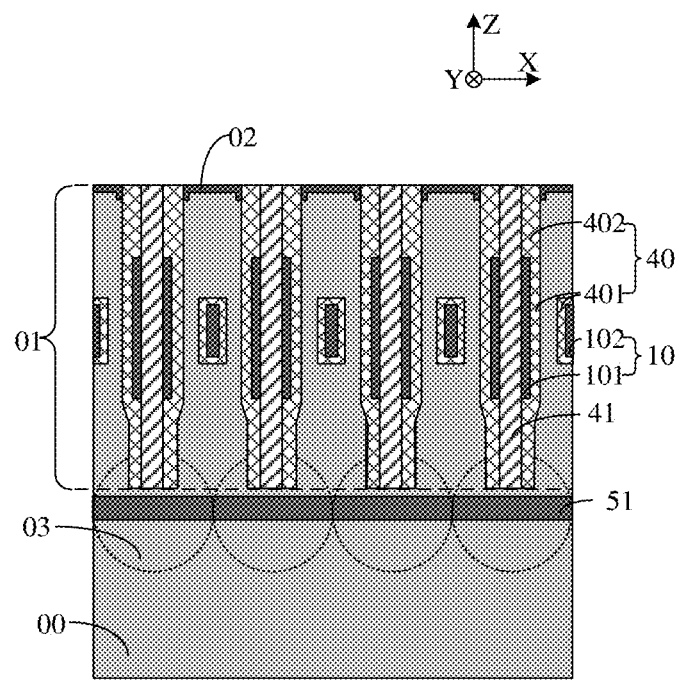
FIG. 24 is a schematic diagram XIV of a method for manufacturing a semiconductor structure provided by an embodiment of the present disclosure.

Then, referring to FIGS. 23 and 24, the conductive layer 70 may be subjected to a grinding process until the top ends of the dielectric layer 40 and the first isolation layer 41 are exposed, so that the remaining conductive layer on the semiconductor pillar 01 forms the contact part 02. The contact part 02 may be made of a metal material, such as titanium nitride or tungsten, so as to reduce the contact resistance between the semiconductor pillar 01 and the capacitor.

Figure 25:
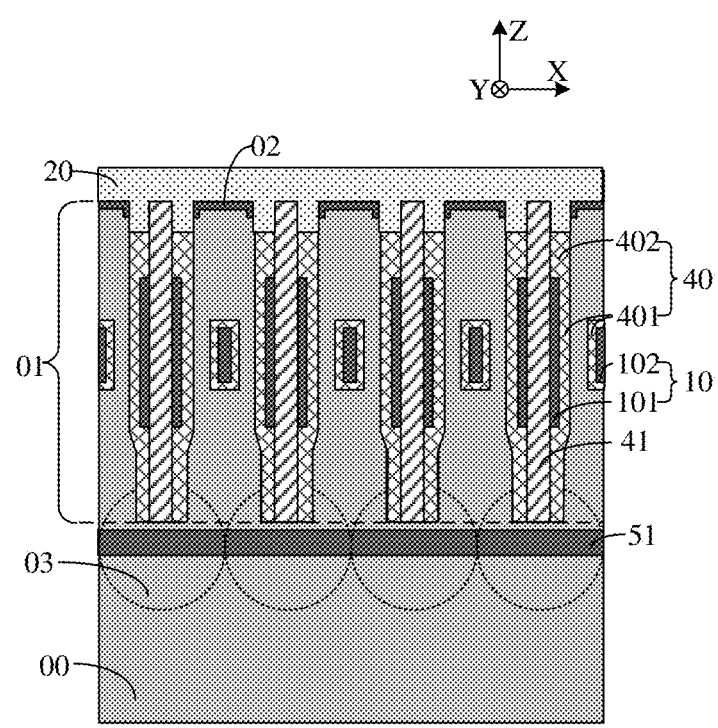
FIG. 25 is a schematic diagram XV of a method for manufacturing a semiconductor structure provided by an embodiment of the present disclosure.

Referring to FIGS. 24 and 25, after the contact part 02 is formed, part of the dielectric layer 40 may be removed by a wet etch process, so that the top of the second part 402 of the dielectric layer 40 is lower than the top of the semiconductor pillar 01. Then, the covering layer 20 may be deposited. The covering layer 20 covers the top of the semiconductor pillar 01 and part of the sidewall close to the top.

It can be seen that the embodiments of the present disclosure provide a semiconductor structure and a method for manufacturing the same. The semiconductor structure includes: a base, gate structures, a dielectric layer, and a covering layer. Herein, the base includes discrete semiconductor pillars. The semiconductor pillars are disposed at the top of the base and extend in a vertical direction. The dielectric layer covers the sidewalls of the semiconductor pillars. The gate structures are disposed in the middle area of the semiconductor pillars. The gate structure includes a gate-all-around structure, the gate-all-around surrounding the semiconductor pillar. A first part of the dielectric layer is disposed between the gate structures and the semiconductor pillars. The covering layer covers the top of the semiconductor pillars and part of the sidewalls close to the top. The material of the covering layer includes a boron-containing compound. In this way, a through hole may be formed on the covering layer, and a part of an electrode plate of a capacitor may be formed in the through hole, so that the semiconductor pillar and the capacitor are electrically connected. Since the material of the covering layer includes a boron-containing compound, the covering layer is easier to be etched than a common insulating dielectric layer, so that the area of the inner wall of a through hole formed by etching may be larger. In this way, on the one hand, the contact area between the capacitor and the semiconductor pillar may be increased, and the contact resistance may be reduced, and on the other hand, the surface area of the electrode plate of the capacitor be increased, and the capacitance may be increased. Thus, the embodiments of the present disclosure improve the overall electrical performance of the semiconductor structure.

It is to be noted that, in the present disclosure, terms "include" and "contain" or any other variant thereof is intended to cover nonexclusive inclusions herein, so that a process, method, object or device including a series of elements not only includes those elements but also includes other elements which are not clearly listed or also includes elements intrinsic to the process, the method, the object or the device. Under the condition of no more limitations, an element defined by the statement "including a/an . . . " does not exclude existence of the same other elements in a process, method, object or device including the element.

The sequence numbers of the embodiments of the present disclosure are adopted not to represent superiority-inferiority of the embodiments but only for description. The methods disclosed in the several method embodiments provided in the present disclosure may be combined arbitrarily without conflict to obtain new method embodiments. The features disclosed in the several product embodiments provided in the present disclosure may be combined arbitrarily without conflict to obtain new product embodiments. The features disclosed in several method or device embodiments provided in the present disclosure may be combined arbitrarily without conflict to obtain new method embodiments or device embodiments.

The above is only the specific implementation mode of the present disclosure and not intended to limit the scope of protection of the present disclosure. Any variations or replacements apparent to those skilled in the art within the technical scope disclosed by the present disclosure shall fall within the scope of protection of the present disclosure. Therefore, the scope of protection of the present disclosure shall be subject to the scope of protection of the claims.

In the embodiments of the present disclosure, since the material of a covering layer includes a boron-containing compound, the covering layer is easier to be etched than a common insulating dielectric layer, so that the area of the inner wall of a through hole formed by etching may be larger. In this way, on the one hand, the contact area between the capacitor and the semiconductor pillar may be increased, and the contact resistance may be reduced, and on the other hand, the surface area of the electrode plate of the capacitor be increased, and the capacitance may be increased. Thus, the embodiments of the present disclosure improve the overall electrical performance of the semiconductor structure.

What is claimed is:

1. A semiconductor structure, comprising:
   a base, comprising discrete semiconductor pillars, the semiconductor pillars being disposed at top of the base and extending in a vertical direction;
   a dielectric layer for covering sidewalls of the semiconductor pillars;
   gate structures disposed in middle area of the semiconductor pillars and comprising a gate-all-around structure, wherein each gate-all-around surrounds the semiconductor pillar, and a first part of the dielectric layer is disposed between the gate structures and the semiconductor pillars; and
   a covering layer for covering top of the semiconductor pillars and part of the sidewalls close to the top, wherein material of the covering layer comprises a boron-containing compound;
   wherein the gate structure further comprises at least one bridge gate structure;
   the at least one bridge gate structure penetrates through the semiconductor pillar and extends to the inner wall of the gate-all-around structure in the penetrating direction; and
   the at least one bridge gate structure is disposed in the semiconductor pillar and is disposed corresponding to middle area of the gate-all-around structure.

2. The semiconductor structure of claim 1, wherein the material of the covering layer comprises a silicon boron material.

3. The semiconductor structure of claim 2, wherein
   the silicon boron material is silicon boron nitride $SiB_xN_y$, where $y-x \leq 2$.

4. The semiconductor structure of claim 2, wherein
   the boron silicon material is Boro Phospho Silicate Glass (BPSG) or boro silicate glass.

5. The semiconductor structure of claim 1, wherein width of each bridge gate structure is less than width of the semiconductor pillar.

6. The semiconductor structure of claim 1, wherein the gate structure further comprises at least two bridge gate structures, the at least two bridge gate structures are stacked at an interval in the vertical direction, and the at least two bridge gate structures are isolated directly by the semiconductor pillar.

7. The semiconductor structure of claim 1, wherein
   top of the gate-all-around structure is lower than the top of the semiconductor pillar; and
   a second part of the dielectric layer covers the top of the gate-all-around structure and is disposed between the gate-all-around structure and the covering layer; and
   thickness of the second part of the dielectric layer is greater than thickness of the first part of the dielectric layer.

8. The semiconductor structure of claim 1, further comprising: a first isolation layer;

the first isolation layer is disposed between adjacent semiconductor pillars, and the gate structure is disposed between the first isolation layer and the semiconductor pillar.

9. The semiconductor structure of claim 1, further comprising: a bit line;
the bit line is disposed inside the base; and bottom of the semiconductor pillar is connected with the bit line.

10. A method for manufacturing a semiconductor structure, comprising:
providing a base, patterning the base, and forming discrete semiconductor pillars on the base, the semiconductor pillars being disposed at top of the base and extending in a vertical direction;
forming a dielectric layer, the dielectric layer covering sidewalls of the semiconductor pillars;
forming gate structures in middle area of the semiconductor pillars, the gate structure comprising a gate-all-around structure, the gate-all-around surrounding the semiconductor pillar, and a first part of the dielectric layer being disposed between the gate structures and the semiconductor pillars; and
forming a covering layer, the covering layer covering top of the semiconductor pillars and part of the sidewalls close to the top, and material of the covering layer comprising a boron-containing compound,
wherein the gate structure further comprises at least one bridge gate structure;
the at least one bridge gate structure penetrates through the semiconductor pillar and extends to the inner wall of the gate-all-around structure in the penetrating direction; and
the at least one bridge gate structure is disposed in the semiconductor pillar and is disposed corresponding to middle area of the gate-all-around structure.

11. The manufacturing method of claim 10, wherein the gate structure further comprises one bridge gate structure, and the forming the gate structure comprises:
forming a groove in the semiconductor pillar;
forming a sacrificial layer in the groove; and
forming a filling layer is formed in the groove, the filling layer being disposed on the sacrificial layer, and remaining groove being filled with the filling layer.

12. The manufacturing method of claim 10, wherein the gate structure further comprises at least two bridge gate structures, and the forming the gate structure comprises:
forming a groove in the semiconductor pillar;
forming a sacrificial layer in the groove;
etching back part of the sacrificial layer, and forming a filling layer in the groove, the filling layer being disposed on remaining sacrificial layer; and
continuing to form the sacrificial layer and the filling layer in the groove in sequence until top of the groove is filled with the filling layer.

13. The manufacturing method of claim 11, wherein the forming the gate structure further comprises:
removing the sacrificial layer to form a through hole, the through hole penetrating through the semiconductor pillar;
forming a first initial dielectric layer on sidewall of the semiconductor pillar and the inner wall of the through hole, wherein part, disposed in the middle area of the semiconductor pillar, of the first initial dielectric layer forms the first part of the dielectric layer;
forming a gate layer around sidewall of the initial dielectric layer and filling the through hole, wherein part of the gate layer for filling the through hole forms a bridge gate structure; and
etching part of the gate layer around the sidewall of the first initial dielectric layer to form the gate-all-around structure.

14. The manufacturing method of claim 13, wherein after the through hole is formed and before the first initial dielectric layer is formed, the manufacturing method further comprises:
etching part of the sidewall of the semiconductor pillar, so that width of the middle area of the semiconductor pillar is smaller than width of bottom of the semiconductor pillar.

15. The manufacturing method of claim 10, wherein the forming the covering layer comprises:
forming a second initial dielectric layer on the gate structure and the semiconductor pillar,
etching the second initial dielectric layer until the top of the semiconductor pillars and part of the sidewalls close to the top are exposed, wherein remaining second initial dielectric layer forms a second part of the dielectric layer; and
covering the top of the semiconductor pillars and the part of the sidewalls close to the top to form the covering layer.

* * * * *